United States Patent
Yamada et al.

(10) Patent No.: US 12,131,980 B2
(45) Date of Patent: Oct. 29, 2024

(54) SEMICONDUCTOR MODULE

(71) Applicant: FUJI ELECTRIC CO., LTD., Kawasaki (JP)

(72) Inventors: Toru Yamada, Kawasaki (JP); Takafumi Yamada, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 519 days.

(21) Appl. No.: 17/483,497

(22) Filed: Sep. 23, 2021

(65) Prior Publication Data

US 2022/0028761 A1 Jan. 27, 2022

Related U.S. Application Data

(63) Continuation of application No. PCT/JP2020/036034, filed on Sep. 24, 2020.

(30) Foreign Application Priority Data

Oct. 15, 2019 (JP) .................. 2019-188628

(51) Int. Cl.
*H01L 23/492* (2006.01)
*H01L 23/00* (2006.01)
(Continued)

(52) U.S. Cl.
CPC .......... *H01L 23/492* (2013.01); *H01L 23/142* (2013.01); *H01L 23/5283* (2013.01); *H01L 23/585* (2013.01); *H01L 24/32* (2013.01); *H01L 24/33* (2013.01); *H01L 2224/32225* (2013.01); *H01L 2224/32258* (2013.01); *H01L 2224/33181* (2013.01)

(58) Field of Classification Search
None
See application file for complete search history.

(56) References Cited

U.S. PATENT DOCUMENTS 7,285,849 B2 * 10/2007 Cruz .................. H01L 21/6835
257/E23.047
2012/0074516 A1 3/2012 Yamaguchi et al.
(Continued)

FOREIGN PATENT DOCUMENTS

JP 2001-110957 A 4/2001
JP 2002-217364 A 8/2002
(Continued)

OTHER PUBLICATIONS

International Search Report for PCT/JP2020/036034, mailed on Dec. 22, 2020.

*Primary Examiner* — Nishath Yasmeen
(74) *Attorney, Agent, or Firm* — Rabin & Berdo, P.C.

(57) ABSTRACT

A semiconductor module includes a semiconductor device having a gate runner extending in a first direction at an upper surface of the semiconductor device, and a metal wiring plate having a first bonding portion with a bonding surface to which the upper surface of the semiconductor device is bonded via a first bonding material. The first bonding portion has a plurality of first protrusions at the bonding surface. Each first protrusion protrudes toward the semiconductor device, and is provided in a position away from the gate runner by a first distance in a plan view of the semiconductor module.

24 Claims, 6 Drawing Sheets

(51) Int. Cl.
*H01L 23/14* (2006.01)
*H01L 23/528* (2006.01)
*H01L 23/58* (2006.01)

(56) References Cited

U.S. PATENT DOCUMENTS

| | | | |
|---|---|---|---|
| 2013/0009295 A1* | 1/2013 | Otremba | H01L 24/83 |
| | | | 257/676 |
| 2014/0054758 A1* | 2/2014 | Yilmaz | H01L 23/49524 |
| | | | 257/669 |
| 2015/0262917 A1 | 9/2015 | Fukui | |
| 2015/0287666 A1* | 10/2015 | Groenhuis | H01L 24/37 |
| | | | 257/676 |
| 2016/0035646 A1 | 2/2016 | Soyano | |
| 2016/0322342 A1 | 11/2016 | Kimura et al. | |
| 2016/0343590 A1* | 11/2016 | Yoshihara | H01L 23/49582 |
| 2017/0117201 A1* | 4/2017 | Yamada | H01L 24/84 |
| 2017/0317016 A1* | 11/2017 | Heinrich | H01L 24/92 |
| 2018/0076149 A1 | 3/2018 | Asai | |
| 2018/0166397 A1 | 6/2018 | Yamada et al. | |
| 2018/0166549 A1 | 6/2018 | Kato et al. | |

FOREIGN PATENT DOCUMENTS

| | | |
|---|---|---|
| JP | 2007-184525 A | 7/2007 |
| JP | 2008-306115 A | 12/2008 |
| JP | 2012-074543 A | 4/2012 |
| JP | 2012-142521 A | 7/2012 |
| JP | 2015-176871 A | 10/2015 |
| JP | 2018-046164 A | 3/2018 |
| JP | 2018-098282 A | 6/2018 |
| JP | 2018-098283 A | 6/2018 |
| JP | 2018-163932 A | 10/2018 |
| WO | 2015/045648 A1 | 4/2015 |
| WO | 2015/107871 A1 | 7/2015 |

* cited by examiner

SEMICONDUCTOR MODULE

CROSS REFERENCE TO RELATED APPLICATIONS

This application is a continuation application of International Application PCT/JP2020/036034 filed on Sep. 24, 2020, which designated the U.S., which claims priority to Japanese Patent Application No. 2019-188628, filed on Oct. 15, 2019, the entire contents of which are incorporated herein by reference.

TECHNICAL FIELD

The present invention relates to a semiconductor module.

BACKGROUND ART

A semiconductor apparatus has a substrate produced with a semiconductor device such as an insulated gate bipolar transistor (IGBT), a power metal oxide semiconductor field effect transistor (MOSFET), or a freewheeling diode (FWD), and is used for an inverter device and the like.

For example, in Patent Literatures 1-3 presented below, a structure has been proposed in which a lead frame is solder-bonded to an emitter electrode of a power semiconductor chip.

CITATION LIST

Patent Literature

Patent Literature 1: Japanese Patent Laid-Open No. 2001-110957
Patent Literature 2: Japanese Patent Laid-Open No. 2012-142521
Patent Literature 3: Japanese Patent Laid-Open No. 2018-163932

SUMMARY OF INVENTION

Technical Problem

In this type of semiconductor module, a chip generates heat with a switching operation. In the structure in which the lead frame is solder-bonded to a surface of the power semiconductor chip as described above, a distortion may occur in a bonding portion due to a fluctuation in internal stress generated with the change in temperature.

An object of the present invention, which has been made in view of the above points, is to provide a semiconductor module that can suppress stress concentration between a chip and a lead frame while ensuring thickness of solder.

Solution to Problem

A semiconductor module in one aspect of the present invention comprises a semiconductor device having a gate runner formed in an upper surface thereof, the gate runner extending in a predetermined direction, and a metal wiring plate arranged on the upper surface of the semiconductor device. The metal wiring plate includes a first bonding portion bonded to the upper surface of the semiconductor device via a first bonding material. The first bonding portion has at least one first protrusion protruding toward the semiconductor device. The first protrusion is provided in a position not overlapping with the gate runner in a plan view. The gate runner and the first protrusion are 0.4 mm or more distant from each other.

Advantageous Effects of Invention

The present invention makes it possible to suppress stress concentration between a chip and a lead frame while ensuring thickness of solder.

DESCRIPTION OF EMBODIMENTS

Figure 1:
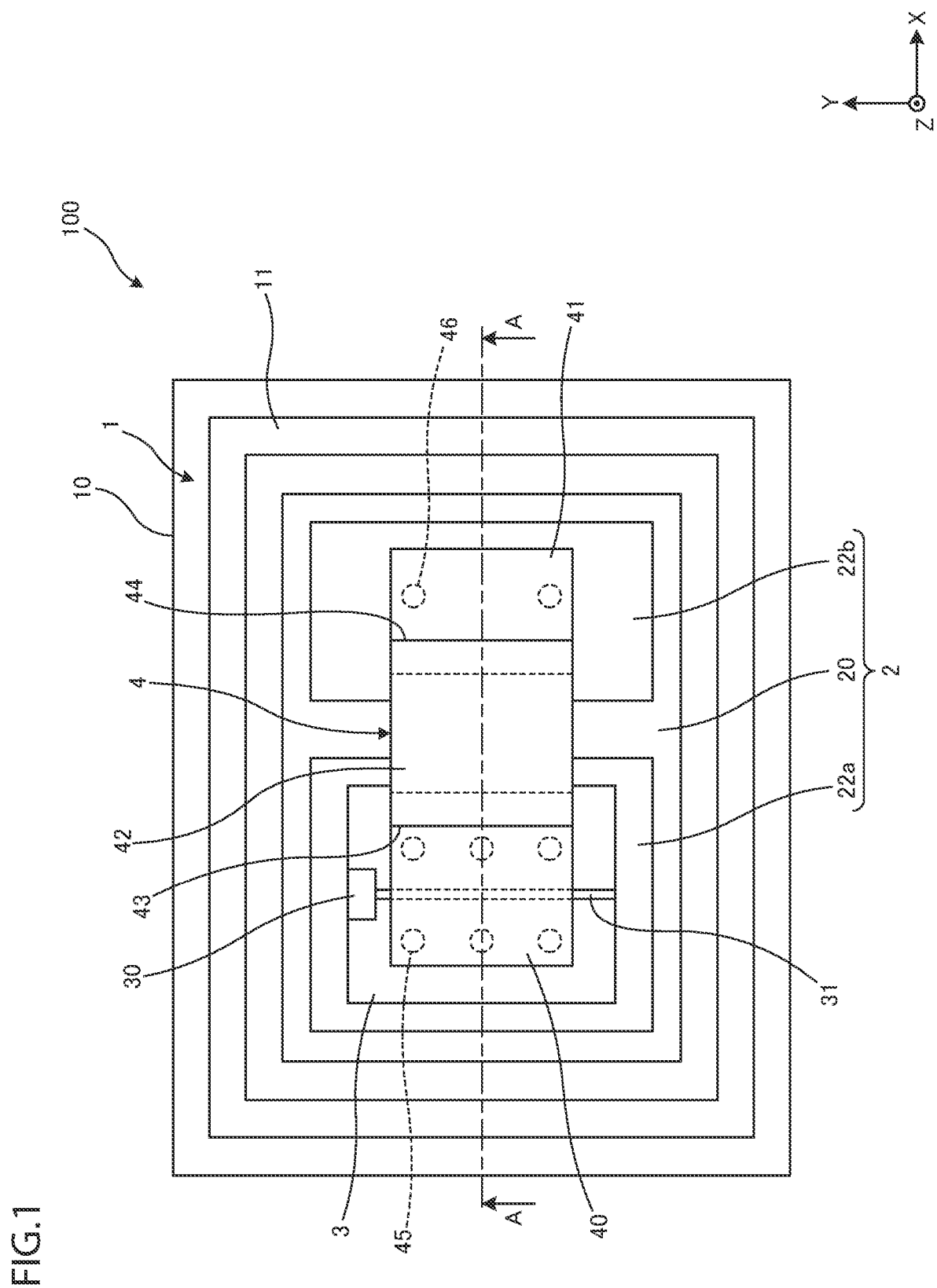
FIG. 1 is a plan view of a semiconductor apparatus according a present embodiment.
Figure 2:
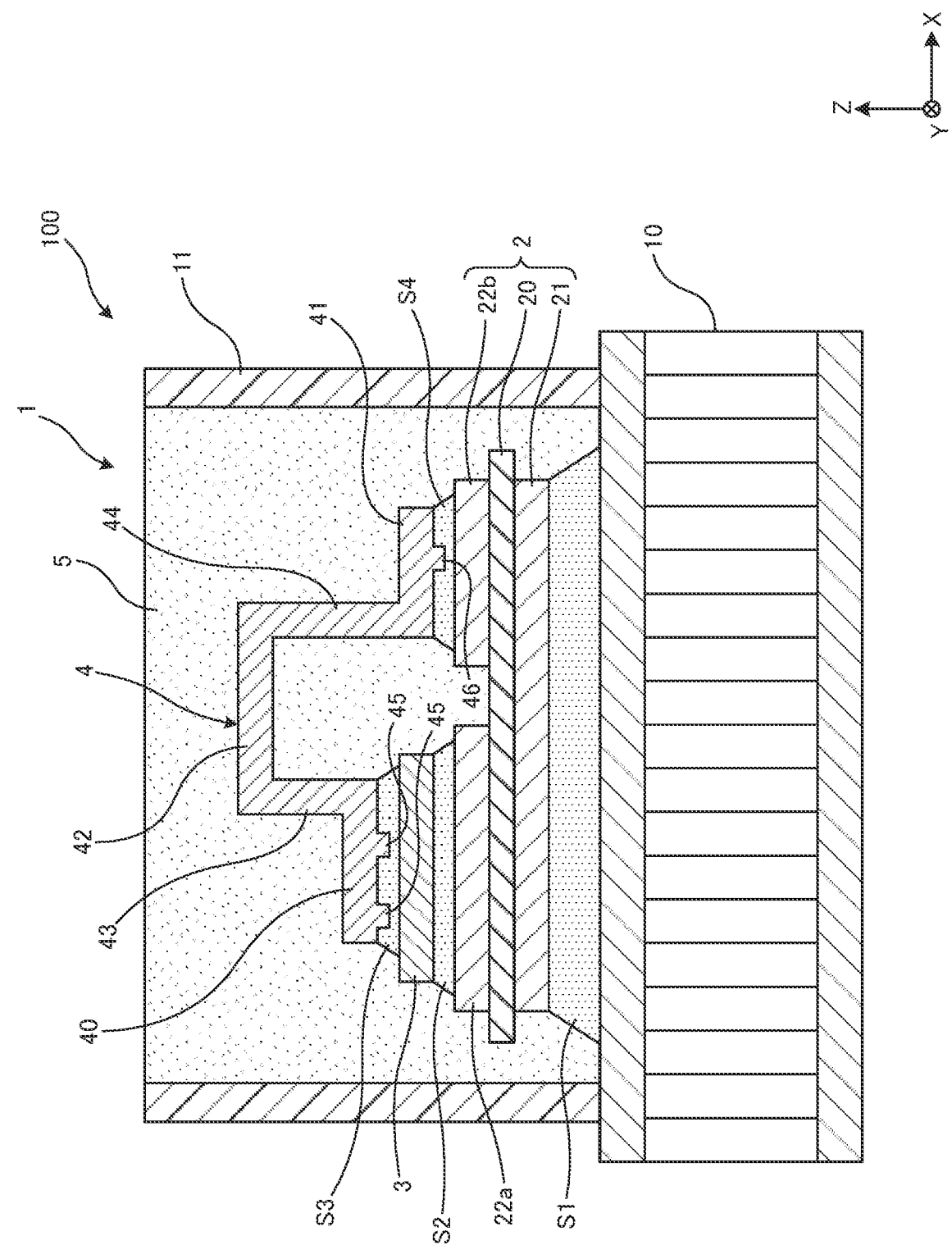
FIG. 2 is a cross sectional view taken along line A-A of the semiconductor apparatus illustrated in FIG. 1.

Hereinafter, a semiconductor apparatus to which the present invention is applicable will be described. FIG. 1 is a plan view of a semiconductor apparatus according a present embodiment. FIG. 2 is a cross sectional view taken along line A-A of the semiconductor apparatus illustrated in FIG. 1. Note that the semiconductor apparatus presented below is merely an example and can be modified as appropriate without being limited thereto.

In addition, it is defined that in figures described below, a longitudinal direction (direction where a plurality of circuit boards described later are arranged) of the semiconductor apparatus is an X direction, a short direction is a Y direction, and a height direction is a Z direction. The illustrated X, Y, and Z axes are orthogonal to each other and form a right-handed system. Furthermore, the X direction, the Y direction, and the Z direction may be referred to as a left-right direction, a front-back direction, and an up-down direction, respectively. These directions (front-back, left-right, and up-down directions) are terms used for convenience of explanation, and the correspondence to each of the X, Y, and Z directions may change depending on the mounting position of the semiconductor apparatus. For example, a heat dissipation surface side (cooler side) of the semiconductor apparatus is considered as a lower surface side and its opposite side is referred to as an upper surface side. In addition, herein, a plan view refers to viewing an upper surface of the semiconductor apparatus from the positive side in the Z direction.

A semiconductor apparatus 100 is applied, for example, to a power converter such as a power module. As illustrated in FIG. 1 and FIG. 2, the semiconductor apparatus 100 is constituted by arranging a semiconductor module 1 on an upper surface of a cooler 10. The cooler 10 has any configuration with respect to the semiconductor module 1.

The cooler 10 is configured to release heat of the semiconductor module 1 to the outside, and has a rectangular parallelepiped shape as a whole. Although not especially illustrated, the cooler 10 is constituted by providing a plurality of fins on a side of a lower surface of a base plate, and accommodating these fins in a water jacket. Note that the cooler 10 can be modified as appropriate without being limited thereto.

The semiconductor module 1 is constituted by arranging a laminated substrate 2, a semiconductor device 3, a metal wiring plate 4, and the like in a case 11.

The laminated substrate 2 is formed by laminating a metal layer and an insulating layer and, for example, is constituted by a direct copper bonding (DCB) substrate, an active metal brazing (AMB) substrate, or a metal-based substrate. Specifically, the laminated substrate 2 includes an insulating plate 20, a metal plate 21 arranged on a lower surface of the insulating plate 20, and a plurality of circuit boards (first circuit board 22a and second circuit board 22b described later) arranged on an upper surface of the insulating plate 20. The laminated substrate 2 is formed into a rectangular shape in a plan view in which length in the X direction is longer than in the Y direction, for example.

The insulating plate 20 has a predetermined thickness in the Z direction and is formed into a flat-plate shape having an upper surface and a lower surface. The insulating plate 20 is formed of, for example, a ceramic material such as alumina ($Al_2O_3$), aluminum nitride (AlN), or silicon nitride ($Si_3N_4$), a resin material such as epoxy, or an insulating material such as an epoxy resin material using a ceramic material as a filler. Note that the insulating plate 20 may be referred to as an insulating layer or an insulating film.

The metal plate 21 has a predetermined thickness in the Z direction and is formed so as to cover the substantially entire lower surface of the insulating plate 20. The metal plate 21 is made of a metal plate having good thermal conductivity, such as copper, aluminum, or an alloy containing them as base materials, for example. The lower surface of the metal plate 21 is a heat dissipation surface. The metal plate 21 is bonded on the upper surface of the cooler 10 via a bonding material S1 such as solder. The metal plate 21 may be arranged on the upper surface of the cooler 10 via a thermal conductive material such as thermal grease or thermal compound.

A main surface of the insulating plate 20 has a plurality of circuit boards insularly (in a mutually electrically insulating state) formed. In the present embodiment, two circuit boards (first circuit board 22a and second circuit board 22b) are formed on the upper surface of the insulating plate 20. There circuit boards each are constituted by a metal layer having a predetermined thickness which is formed of copper foil or the like. The first circuit board 22a and the second circuit board 22b have a rectangular shape in a plan view, and are arranged side by side in the X direction on the insulating plate 20. In FIG. 1, the first circuit board 22a is positioned on the left side (negative side in the X direction) and the second circuit board 22b is positioned on the right side (positive side in the X direction).

The semiconductor device 3 is arranged on the upper surface of the first circuit board 22a via a bonding material S2 such as solder. The semiconductor device 3 is formed into a square shape in a plan view by a semiconductor substrate such as silicon (Si) or silicon carbonate (SiC), for example. In the present embodiment, the semiconductor device 3 is constituted by a reverse-conducting—insulated gate bipolar transistor (RC-IGBT) device in which functions of an IGBT device and a freewheeling diode (FWD) device are integrated.

Note that the semiconductor device 3 is not limited to this and may be constituted by combining a switching device such as an IGBT or power metal oxide semiconductor field effect transistor (MOSFET) and a diode such as a freewheeling diode (FWD). In addition, a reverse blocking (RB)-IGBT or the like having a sufficient withstand voltage against a reverse bias may be used as the semiconductor device 3. The semiconductor device 3 may be a vertical switching device or a vertical diode. Furthermore, the shape, number of arrangements, and arrangement positions of the semiconductor devices 3 can be changed as appropriate.

The semiconductor device 3 has an electrode formed on each of the upper surface and the lower surface. For example, the electrode on a side of the upper surface (upper surface electrode) is constituted by an emitter electrode (source electrode) or a gate electrode, and the electrode on a side of the lower surface (lower surface electrode) is constituted by a collector electrode (drain electrode). In addition, on the upper surface of the semiconductor device 3, a gate pad 30 and a gate runner 31 constituting gate wiring with respect to the gate pad 30 are formed so that the semiconductor device 3 is divided in the center. A detailed structure in the surface of the semiconductor device 3 will be described later.

On the upper surface of the semiconductor device 3, the metal wiring plate 4 is arranged. The metal wiring plate 4 is constituted by a plate body having an upper surface and a lower surface, and, for example, is formed by a metal material such as a copper material, a copper alloy material, an aluminum alloy material, or an iron alloy material. The metal wiring plate 4 is formed into a predetermined shape by press working, for example. Note that the shape of the metal wiring plate 4 described below is merely an example and can be modified as appropriate. Furthermore, the metal wiring plate may be also referred to as a lead frame.

The metal wiring plate 4 according to the present embodiment has a long body extending in the X direction to be placed over the first circuit board 22a and the second circuit board 22b in a plan view, and has a crank-like shape bent a plurality of times in a side view.

Specifically, the metal wiring plate 4 includes a first bonding portion 40 bonded to the upper surface of the semiconductor device 3 via a bonding material S3 (first bonding material), a second bonding portion 41 bonded to the upper surface of the second circuit board 22b via a bonding material S4 (second bonding material), and a connecting portion 42 connecting the first bonding portion 40 and the second bonding portion 41. The width in the Y direction of the metal wiring plate 4 is uniform from the first bonding portion 40 to the second bonding portion 41. In addition, the first bonding portion 40, the second bonding portion 41, and the connecting portion 42 are arranged in a row along the X direction in a plan view. More specifically, the first bonding portion 40, the second bonding portion 41, and the connecting portion 42 are arranged in a row in a direction (X direction) perpendicular to the extending direction (Y direction) of the gate runner 31, i.e., along a direction in which a plurality of second protrusions 46 described later are arranged.

The first bonding portion 40 has a rectangular shape smaller than an outer shape of the semiconductor device 3 in a plan view. On an end portion on the positive side in the X direction (on a side of the second circuit board 22b) of the first bonding portion 40, a first bending portion 43 bent upward at a substantially right angle is formed. To an upper end of the first bending portion 43, one end (left end) of the connecting portion 42 is connected. Although the details will be described later, on a lower surface of the first bonding portion 40, a first protrusion 45 protruding toward the semiconductor device 3 is formed.

The second bonding portion 41 has a rectangular shape smaller than an outer shape of the second circuit board 22b in a plan view. On an end portion on the negative side in the X direction (on a side of the first circuit board 22a) of the second bonding portion 41, a second bending portion 44 bent upward at a substantially right angle is formed. To an upper end of the second bending portion 44, the other end (right end) of the connecting portion 42 is connected. Although the details will be described later, on a lower surface of the second bonding portion 41, the second protrusions 46 protruding toward the second circuit board 22b are formed.

The connecting portion 42 extends in the horizontal direction. As described above, one end of the connecting portion 42 is connected to the first bending portion 43, and the other end thereof is connected to the second bending portion 44.

The length in the Z direction of the first bending portion 43 is shorter than the length of the second bending portion 44 by an amount of the thickness of the semiconductor device 3. That is, the first bonding portion 40 and the second bonding portion 41 are provided at positions having different heights. More specifically, the first bonding portion 40 is provided at a position higher than the second bonding portion 41.

As described above, the first bonding portion 40 is electrically bonded to the upper surface of a main electrode of the semiconductor device 3 via the bonding material S3 such as solder. In addition, the second bonding portion 41 is electrically bonded to the upper surface of the second circuit board 22b via the bonding material S4 such as solder.

The laminated substrate 2, the semiconductor device 3, and the metal wiring plate 4 are surrounded by the case 11. The case 11 has a square annular cylindrical or frame shape in a plan view, and, for example, is formed of a synthetic resin. In the case 11, a lower end is bonded to the upper surface of the cooler 10 via an adhesive, and an upper end extends to a position sufficiently higher than the upper surface of the metal wiring plate 4. That is, the case 11 defines a space which accommodates the laminated substrate 2, the semiconductor device 3, and the metal wiring plate 4.

As described above, an internal space defined by the case 11 is filled with a sealing resin 5. Filling with the sealing resin 5 may be performed such that an upper surface of the sealing resin 5 reaches an upper end of the case 11. Accordingly, the laminated substrate 2, the semiconductor device 3, and the metal wiring plate 4 are sealed. Note that as the sealing resin 5, an epoxy resin or silicone gel can be used.

As described above, in the structure in which the semiconductor device formed by the semiconductor substrate such as silicon or silicon carbonate and the metal wiring plate (lead frame) made of the metal such as copper are soldered to each other, a chip generates heat with a switching operation of the semiconductor device. As the temperature changes in this way, in a periphery of the bonding portion, a shear stress (internal stress) may be generated due to a difference between an expansion amount and a contraction amount. The shear stress is likely to be greatest in an outer edge of the bonding portion.

In the semiconductor device having large capacity, the gate runner as the gate wiring may be provided to cross the center of the semiconductor device, as described above. Accordingly, the solder between the semiconductor device and the metal wiring plate is divided by the gate runner. As a result, the shear stress may also concentrate on a boundary portion along the gate runner.

Therefore, a method of increasing the thickness of the solder between the semiconductor device and the metal wiring plate and increasing a distance between the semiconductor device having a large young's modulus and the metal wiring plate having a relatively small young's modulus is effective to relax the shear stress.

However, in the structure in which in addition to the bonding between the semiconductor device and the metal wiring plate, the solder bonding is involved across the multiple layers for the bonding between the semiconductor device and the insulating substrate, the bonding between the insulating substrate and the base plate for the cooler, and so on, it is difficult to control the thickness of the solder to an extent that the stress relaxation effect can be obtained. It is conceivable to provide a boss on the metal wiring plate as a method of ensuring the solder thickness, but the boss itself acts as a stress concentration point, which may cause the breakage of the bonding portion.

Then, the inventors have focused attention on the positional relationship between the boss for ensuring the solder thickness and the gate runner in which the stress concentration may occur, and have conceived the present invention. Specifically, in the present embodiment, the gate runner 31 is formed on the upper surface of the semiconductor device 3 to extend in a predetermined direction (Y direction in the present embodiment). The metal wiring plate 4 includes the first bonding portion 40 bonded to the upper surface of the semiconductor device 3 via the bonding material S3. On a back surface side of the first bonding portion 40, the first protrusion 45 protruding toward the semiconductor device 3 is formed. The first protrusion 45 is provided in a position not overlapping with the gate runner 31 in a plan view. The first protrusion 45 may be provided apart from the gate runner 31 in a plan view. Furthermore, the inventors have found that the gate runner 31 and the first protrusion 45 are 0.4 mm or more distant from each other, which makes it possible to suppress the stress concentration between the semiconductor device and the metal wiring plate while ensuring the thickness of the solder.

According to this configuration, providing the first protrusion 45 enables a gap to be formed between the first bonding portion 40 and the semiconductor device 3 by at least an amount of the height of the first protrusion 45. Filling the gap with the bonding material S3 makes it possible to ensure the thickness of the bonding material S3. In addition, the first protrusion 45 is arranged not to overlap with the gate runner 31 in a plan view, so that the distance between the first protrusion 45 and the gate runner 31 are set to 0.4 mm or more, whereby the thickness of the bonding material S3 around the gate runner 31 can be sufficiently ensured and the stress concentration can be suppressed. This makes it possible to suppress the stress concentration between the semiconductor device and the metal wiring plate while ensuring the thickness of the solder.

Also, on a back surface side of the second bonding portion 41, the second protrusion 46 protruding toward the second circuit board 22b is formed. This makes it possible to form a gap between the second bonding portion 41 and the second circuit board 22b by at least an amount of the height of the second protrusion 46. Filling the gap with the bonding material S4 makes it possible to ensure the thickness of the bonding material S4.

Figure 3:
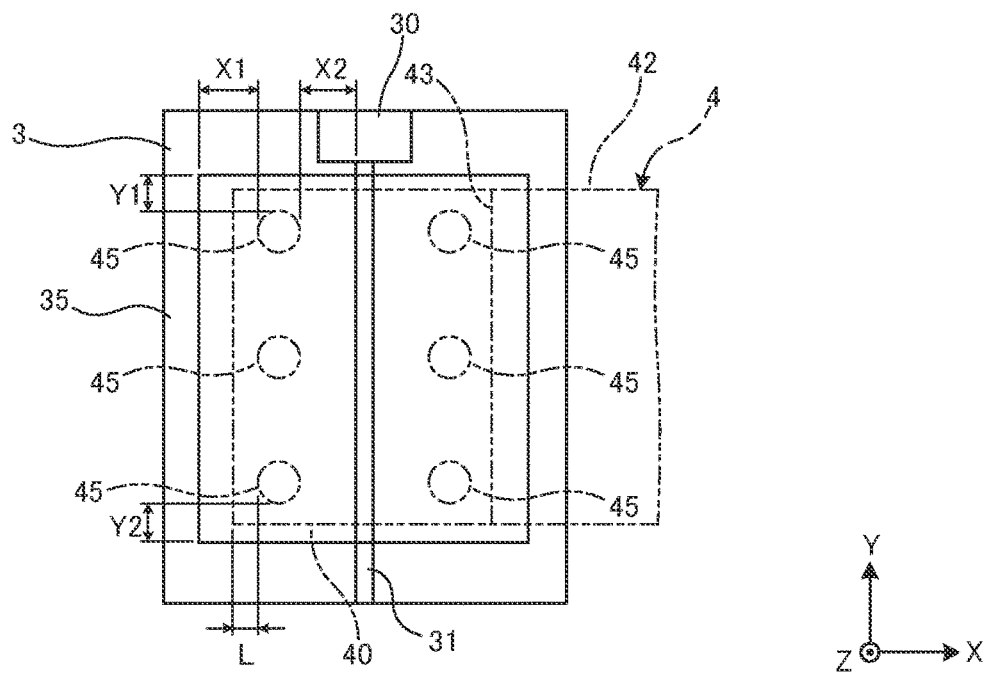
FIG. 3 is a partially enlarged view of FIG. 1.

Next, a detailed structure in the surface of the semiconductor device will be described with reference to FIG. 3 and FIG. 4. FIG. 3 is a partially enlarged view of FIG. 1. FIG.

4 is a partially enlarged view of FIG. 2. Note that the surface structure of the semiconductor device is not limited to the example presented below and can be modified as appropriate.

As illustrated in FIG. 3, on the upper surface of the semiconductor device 3, the gate pad 30 is arranged in the center of the end portion on the positive side in the Y direction. The gate pad 30 constitutes the gate electrode. In addition, on the upper surface of the semiconductor device 3, the gate runner 31 is formed. The gate runner 31 has a predetermined width in the X direction, and extends in the Y direction. In addition, one end of the gate runner 31 is connected to the gate pad 30, and the other end thereof extends to the end portion on the negative side in the Y direction of the semiconductor device 3. The center on the upper surface of semiconductor device 3 is divided by the gate runner 31 into two in the X direction.

Figure 4:
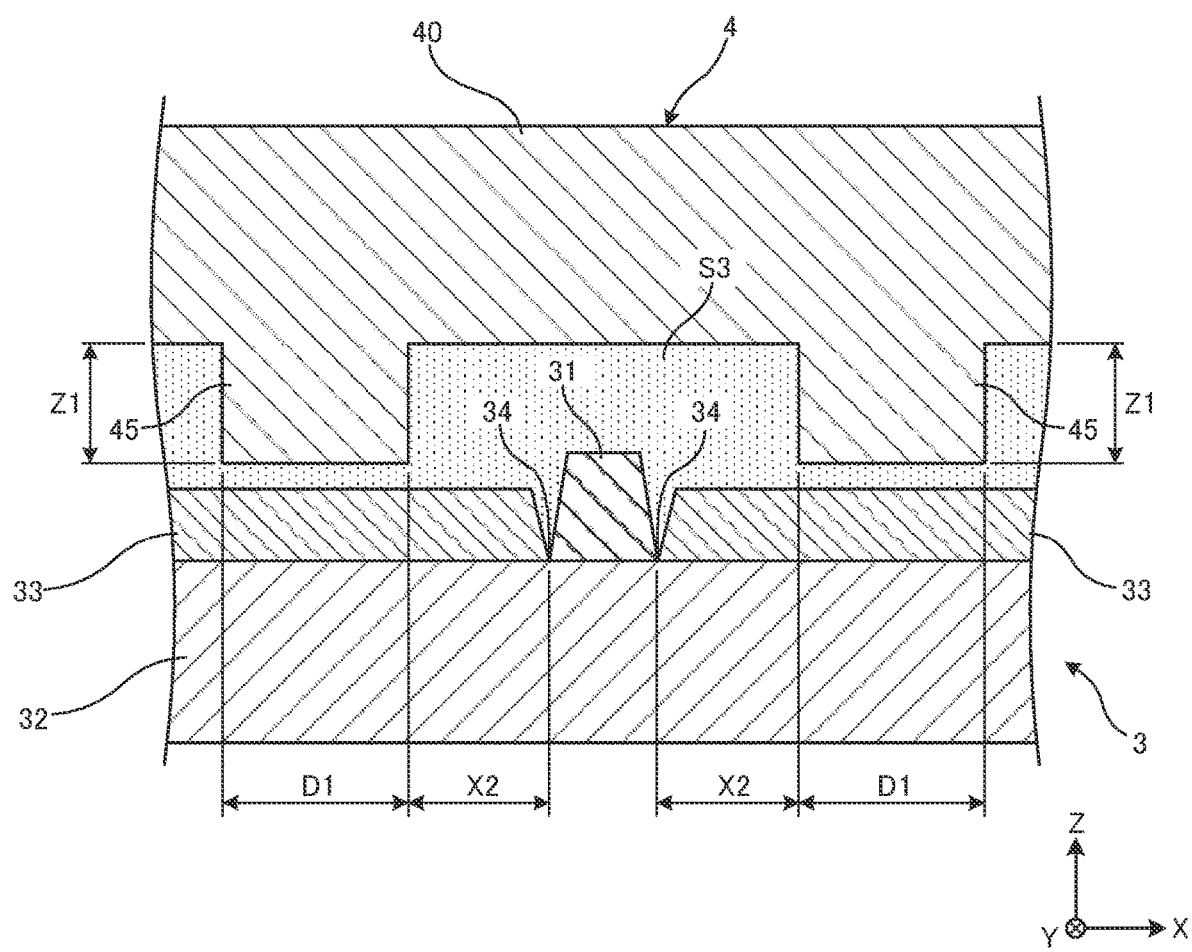
FIG. 4 is a partially enlarged view of FIG. 2.

More specifically, as illustrated in FIG. 4, an upper surface electrode 32 having a predetermined thickness is provided on the upper surface of the semiconductor device 3. The upper surface electrode 32 is formed in a predetermined region in a substrate upper surface of the semiconductor device 3. The above gate pad 30 is formed in a region separately from (independently of) the upper surface electrode 32. The upper surface electrode 32 constitutes the emitter electrode, for example. The upper surface electrode 32 is formed by, for example, aluminum or a metal containing aluminum or the like.

On the upper surface of the upper surface electrode 32, a plating layer 33 having a predetermined thickness is provided. The plating layer 33 is formed by, for example, nickel or a metal containing nickel or the like. The above gate runner 31 is formed to pass through the plating layer 33 in the upper surface of the upper surface electrode 32.

The gate runner 31 includes a conducting portion (not illustrated) formed by polysilicon or the like doped with impurities and an insulating portion formed by polyimide or the like covering the conducting portion. The insulating portion serves to insulate the conducting portion from the upper surface electrode 32, the plating layer 33, and the bonding material S3. The upper surface of the gate runner 31 (insulating portion) is provided at a position higher than the upper surface of the plating layer 33. That is, the thickness of the gate runner 31 is set to be greater than the thickness of the plating layer 33.

Both side surfaces in the X direction of the gate runner 31 are inclined so that a facing distance (width) becomes narrower upward. In this way, a cross section of the gate runner 31 forms a trapezoidal shape (see FIG. 4). On the other hand, a side surface of the plating layer 33 facing the side surface of the gate runner 31 is inclined away from the side surface of the gate runner 31 as it extends upward. That is, the facing distance between the side surface of the gate runner 31 and the side surface of the plating layer 33 increases with increasing distance from the upper surface electrode 32.

In this way, on the upper surface of the semiconductor device 3, a boundary portion 34 in which the above gate runner 31, upper surface electrode 32 and plating layer 33 gather one another is formed. In the boundary portion 34, the gate runner 31, the upper surface electrode 32, and the plating layer 33 may be close to one another to partially contact one another or partially overlap with one another. The boundary portion 34 is linearly formed to extend in the Y direction along the outer edge of the lower end portion of the gate runner 31. Note that the boundary portion 34 may be referred to as a triple point in a cross-sectional view illustrated in FIG. 4. A guard ring 35 may be provided around the plating layer 33 on the upper surface of the semiconductor device 3. The end portion of the gate runner 31 is connected to the guard ring 35.

Next, a detailed structure of the metal wiring plate 4 will be described. As illustrated in FIG. 3 and FIG. 4, a plurality of first protrusions 45 are provided on the lower surface of the first bonding portion 40. In the present embodiment, the number of first protrusions 45 is six in total, two in the X direction and three in the Y direction. The six first protrusions 45 are arranged along the outer peripheral edge of the first bonding portion 40.

For example, in the X direction, the first protrusion 45 is provided at a position distant from the guard ring 35 by a predetermined distance (second distance) X1 and distant from the gate runner 31 by a predetermined distance (first distance, third distance) X2. In addition, in the Y direction, the first protrusions 45 which are positioned on the outermost peripheral side are provided at positions distant from the guard ring 35 in the Y direction of the first bonding portion 40 by predetermined distances (fourth distances) Y1 and Y2, respectively. The distance (X2) between the gate runner 31 and the first protrusion 45 is 0.4 mm or more in a plan view. The two first protrusions 45 which are arranged in the X direction are arranged to sandwich the gate runner 31 therebetween in a plan view. The gate runner 31 may be arranged between a pair of first protrusions 45. Furthermore, the distance (X1, Y1, Y2) between the guard ring 35 and the first protrusion 45 is also preferably 0.4 mm or more.

The first protrusion 45 is formed into a columnar shape having an outer diameter D1, for example. In addition, the first protrusion 45 protrudes at a protrusion height Z1 from the lower surface of the first bonding portion 40 toward the semiconductor device 3. The side surface (cylindrical surface) of the first protrusion 45 is perpendicular to the lower surface of the first bonding portion 40. The outer diameter D1 of the first protrusion 45 may be, for example, 0.4 mm to 1.5 mm, and preferably 0.6 mm to 1.2 mm. When the outer diameter D1 is large, the distance between the first protrusion 45 and the gate runner 31 is reduced, which unfavorably causes deterioration in degree of design freedom. When the outer diameter D1 is small, the stress unfavorably concentrates on the upper surface electrode 32. The protrusion height Z1 of the first protrusion 45 may be 50 μm or more and 300 μm or less, and preferably 100 μm or more and 200 μm or less. When the protrusion height Z1 is large, the void is easily generated in the bonding material S3. When the protrusion height Z1 is small, the bonding material S3 becomes thin, whereby the stress on the upper surface electrode 32 increases.

In addition, as illustrated in FIG. 1 and FIG. 2, on the lower surface of the second bonding portion 41, the plurality of second protrusions 46 are provided. In the present embodiment, the two second protrusions 46 are provided side by side in the Y direction. The two second protrusions 46 are arranged by being offset on the outer peripheral side of the second bonding portion 41. The shape of the second protrusion 46 may be the same as or different from that of the above first protrusion 45.

The shape, arrangement, and number of arrangements of the above first protrusions 45 and second protrusions 46 can be changed as appropriate without being limited thereto. For example, the shape of the first protrusions 45 and second protrusions 46 is not limited to a columnar shape, and may be a prismatic shape, a truncated cone shape tapering downward, or a hemispherical shape.

In the semiconductor module 1 thus configured, the first protrusion 45 is provided at the position not overlapping with the gate runner 31 in a plan view (see FIG. 3), and the first protrusion 45 is provided at the position distant from the gate runner 31 by the predetermined distance X2 (see FIG. 4). More specifically, the outer edge of the first protrusion 45 is distant from the boundary portion 34 by the predetermined distance X2. In this case, the predetermined distance X2 is preferably 0.4 mm or more.

According to this configuration, the first protrusion 45 does not overlap with the gate runner 31, which makes it possible to ensure the thickness of the bonding material S3 between the semiconductor device 3 and the first bonding portion 40 around the gate runner 31, according to the protrusion height Z1 of the first protrusion 45. Since the stress may concentrate on the boundary portion 34 as described above, the effect of suppressing the stress concentration can be enhanced by ensuring the thickness of the bonding material S3 around the boundary portion 34.

The thickness of the bonding material S3 between the lower surface of the first protrusion 45 and the upper surface of the semiconductor device 3 is relatively thin. However, the first protrusion 45 is distant from the boundary portion 34 by the predetermined distance X2, and the lower surface of the first protrusion 45 faces the plating layer 33. The plating layer 33 has high rigidity than the boundary portion 34, and is less likely to be affected by the stress concentration. Therefore, no problem arises even when the thickness of the bonding material S3 is relatively thin.

In the present embodiment, the sum of the areas of the plurality of first protrusions 45 is preferably 0.5% or more and 25% or less of the area of the first bonding portion 40. That is, the area ratio of the plurality of first protrusions 45 to the first bonding portion 40 is 1.0% or more and 20% or less as a more preferable range. Specifically, when the four first protrusions 45 having 00.4 mm are present with respect to the first bonding portion 40 having a width of 7 mm, the area ratio is 1%. In addition, when the four first protrusions 45 having ϕ1.5 mm are present, the area ratio is 20%, and when the six first protrusions 45 having ϕ1.6 mm are present, the area ratio is 25%. The reason why the area ratio is set in such range is because when the first protrusions 45 are too small, the stress concentrates on the proximity of the first protrusions 45, which leads to the breakage of the upper surface electrode 32. On the other hand, the reason is because when the first protrusions 45 are too large, the area of a thin portion of the bonding material S3 increased, which may cause cracks or separation in the thin portion of the bonding material S3.

In the present embodiment, the plurality of first protrusions 45 are arranged along an outer peripheral edge of the first bonding portion 40 in a predetermined range from the outer peripheral edge. Accordingly, the first bonding portion 40 having a rectangular shape can be stably arranged on the semiconductor device 3, and the metal wiring plate 4 itself can be prevented from collapsing. Similarly, the plurality of second protrusions 46 are arranged by being offset on the outer peripheral side of the second bonding portion 41. Accordingly, the second bonding portion 41 having a rectangular shape can be stably arranged on the second circuit board 22b. In particular, the first bonding portion 40 and the second bonding portion 41 are provided at the positions having different heights in the Z direction, and therefore may easily collapse. In the present embodiment, the plurality of first protrusions 45 and second protrusions 46 can easily maintain the posture of the metal wiring plate 4.

Figure 5:
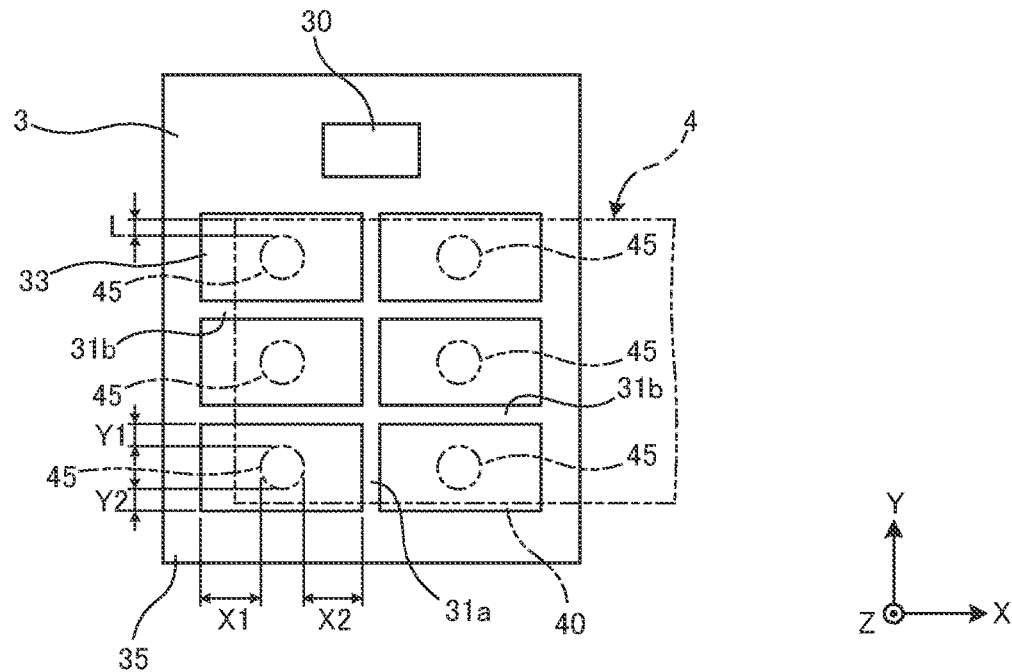
FIG. 5 is a plan view of a semiconductor device according to a modification.
Figure 6:
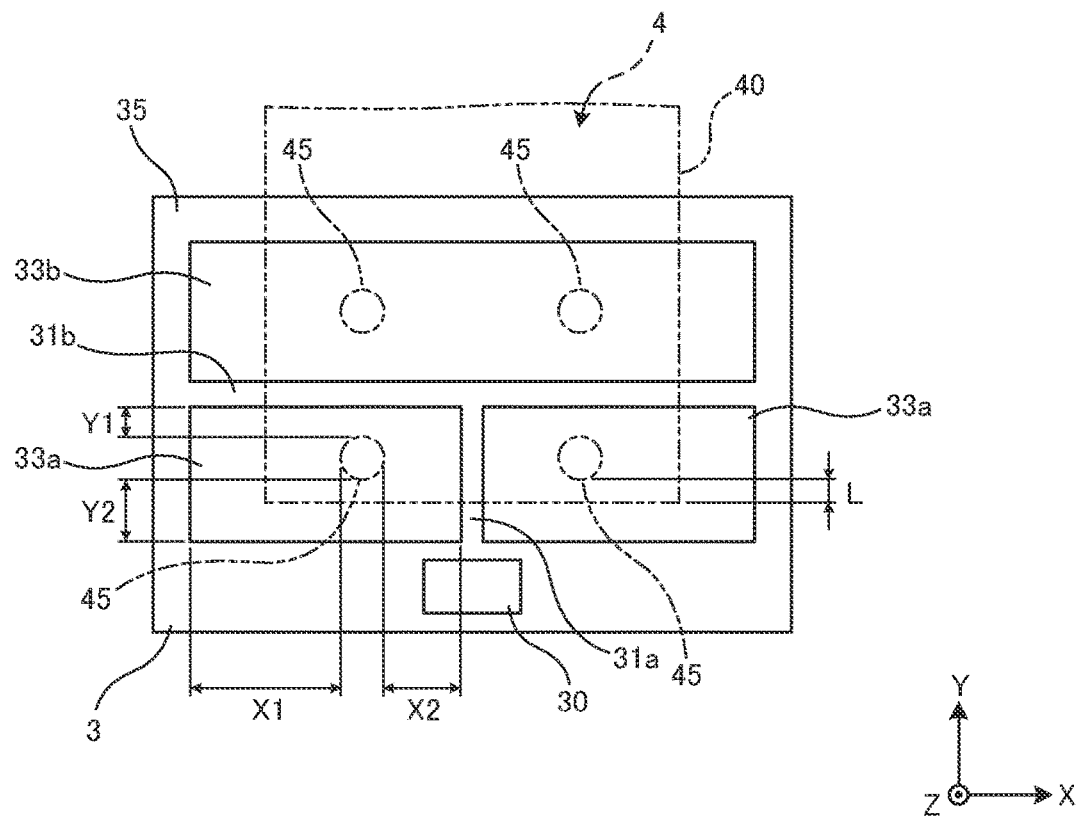
FIG. 6 is a plan view of a semiconductor device according to another modification.

Next, a modification will be described. In the above embodiment, description has been made regarding a case where the gate runner 31 extending in the Y direction is formed in the center of the upper surface of the semiconductor device 3; however, the shape of the gate runner can be modified as appropriate without being limited thereto. For example, the gate runner may have a configuration illustrated in FIG. 5 and FIG. 6. FIG. 5 is a plan view of a semiconductor device according to a modification. FIG. 6 is a plan view of a semiconductor device according to another modification. Note that the modification presented below is different from the above embodiment only in the configuration of the gate runner. Thus, only the major different points will be described, and same reference signs are applied to the common components and description thereof is omitted as appropriate.

As illustrated in FIG. 5, a gate runner according to the modification is formed into a lattice shape. Specifically, the gate runner includes a first runner portion 31a extending in the Y direction, and a second runner portion 31b extending in the X direction. One end of the first runner portion 31a is connected to the gate pad 30, and the other end thereof extends to an end portion on the negative side in the Y direction of the semiconductor device 3. The upper surface of semiconductor device 3 is divided in the center by the first runner portion 31a into two in the X direction.

The second runner portion 31b extends from one end portion to the other end portion in the X direction of the semiconductor device 3 to intersect the first runner portion 31a. The two second runner portions 31b are arranged side by side in the Y direction. The upper surface of the semiconductor device 3 is divided by the two second runner portions 31b into three in the Y direction. That is, the upper surface (plating layer 33) of the semiconductor device 3 is divided by the lattice-like gate runner into six.

Around the outer periphery of the six-partitioned plating layers 33, a guard ring 35 having a rectangular frame shape is formed. The guard ring 35 is connected to both ends of the first runner portion 31a and both ends of each of the second runner portions 31b.

On each upper surface of the six-partitioned plating layers 33, a first protrusion 45 is arranged. That is, the first protrusion 45 is provided at a position not overlapping with the gate runner. Note that the configuration is not limited to a case where one first protrusion 45 is arranged in one plating layer 33, and a plurality of first protrusions 45 may be arranged in one plating layer 33. The first protrusion 45 is provided distant from the guard ring 35 by a distance X1 and distant from the gate runner 31a by a distance X2 in the X direction. In addition, the first protrusion 45 is provided distant from the gate runner 31b by a distance Y1 and distant from the guard ring 35 by a distance Y2 in the Y direction. The distance (X2, Y1) between the gate runner 31a, 31b and the first protrusion 45 is 0.4 mm or more in a plan view.

As illustrated in FIG. 6, a gate runner according to another modification is formed into a T shape in a plan view. Specifically, the gate runner includes a first runner portion 31a extending in the Y direction, and a second runner portion 31b extending in the X direction. One end of the first runner portion 31a is connected to the gate pad 30, and the other end thereof is connected to the center of the second runner portion 31b. The second runner portion 31b extends from one end portion to the other end portion in the X direction of the semiconductor device 3. The upper surface (plating layer) of semiconductor device 3 is divided by the T-shaped gate runner into three.

For convenience of description, among three-partitioned regions, the two regions on the negative side in the Y direction each are referred to as a plating layer 33a, and one region on the positive side in the Y direction is referred to as a plating layer 33b. The two plating layers 33a are defined by the first runner portion 31a. In addition, the width in the X direction of the plating layer 33b corresponds to the sum of the widths of the two plating layers 33a.

Around the outer periphery of the three-partitioned plating layers 33a and 33b, a guard ring 35 having a rectangular frame shape is formed. The guard ring 35 is connected to one end of the first runner portion 31a and both ends of the second runner portion 31b.

On each upper surface of the three-partitioned plating layers 33a and 33b, a first protrusion 45 is arranged. Specifically, one first protrusion 45 is arranged on one plating layer 33a, and the two first protrusions are arranged side by side in the X direction on the plating layer 33b. That is, the first protrusion 45 is provided at a position not overlapping with the gate runner. The first protrusion 45 is provided distant from the guard ring 35 by a distance X1 and distant from the gate runner 31a by a distance X2 in the X direction. In addition, the first protrusion 45 is provided distant from the gate runner 31b by a distance Y1 and distant from the guard ring 35 by a distance Y2 in the Y direction. The distances (X2, Y1) between the gate runner 31a, 31b and the first protrusion 45 is 0.4 mm or more in a plan view. Also, in the configurations thus illustrated in FIG. 5 and FIG. 6, the same operational effects as those in the above embodiments can be achieved. In this way, in the examples illustrated in FIGS. 3, 5, and 6, the gate runner 31, 31a, 31b and the first protrusion 45 are 0.4 mm or more distant from each other. In addition, the distance between the guard ring 35 and the first protrusion 45 is preferably 0.4 mm or more. When the first protrusion 45 is distant from the guard ring 35 by 0.4 mm or more, the first protrusion 45 may have a smaller impact on the upper surface electrode 32. Furthermore, the first protrusion 45 is preferably provided inside of the first bonding portion 40 so that a distance L from the outer edge of the first bonding portion 40 is in a range of 0.4 mm or more and 2.0 mm or less, and preferably in a range of 0.8 mm or more and 1.3 mm or less. Such arrangement of the first protrusion 45 can reduce the unintended inclination of the metal wiring plate 4. Note that when the outer edge of the first bonding portion 40 and the first protrusion 45 are not separated by a certain distance, the stress concentrates on the outer edge of the bonding material S3, especially, a fillet portion of the bonding material S3, which easily causes cracks. On the other hand, when the distance from the outer edge of the first bonding portion 40 to the first protrusion 45 is too large, there is a risk that the unintended inclination of the metal wiring plate 4 increases.

Figure 7:
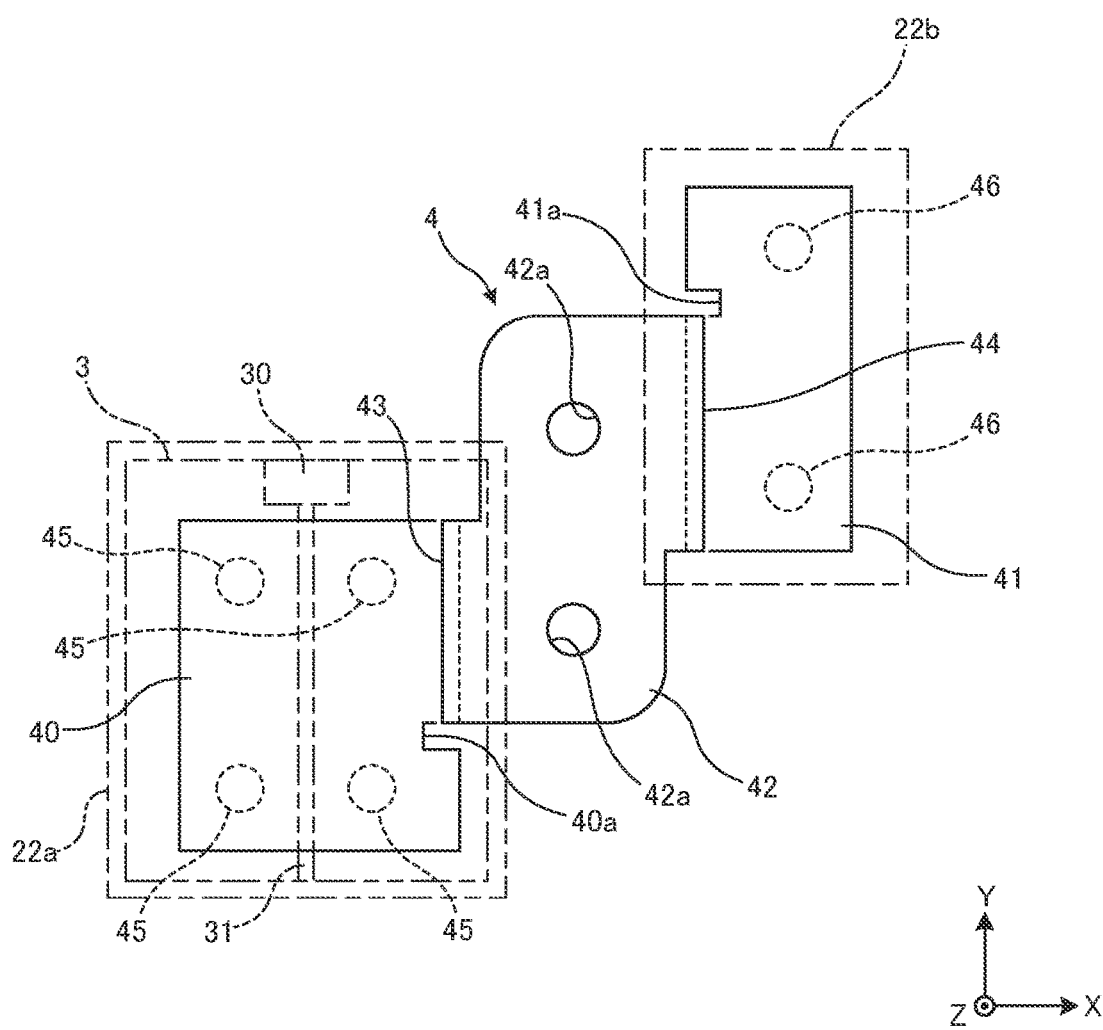
FIG. 7 is a plan view of a metal wiring plate according to the modification.

In the above embodiments, description has been made a case where the metal wiring plate 4 is formed to have uniform width from the first bonding portion 40 to the second bonding portion 41, and the first bonding portion 40, the second bonding portion 41, and the connecting portion 42 are arranged in a row along the X direction in a plan view; however, this configuration is not limited thereto. For example, the metal wiring plate 4 may have a configuration illustrated in FIG. 7. FIG. 7 is a plan view of a metal wiring plate according to the modification. Also in FIG. 7, only the major different points will be described, and same reference signs are applied to the common components and description thereof is omitted as appropriate.

As illustrated in FIG. 7, in the metal wiring plate 4 according to the modification, the first bonding portion 40 and the second bonding portion 41 are arranged to obliquely face each other, with the connecting portion 42 being sandwiched therebetween in a plan view. Specifically, the connecting portion 42 has a rectangular shape which is longer in the Y direction, in a plan view. In the connecting portion 42, two through holes 42a that penetrate in the thickness direction are formed. Two through holes 42a are arranged side by side in the Y direction. The number of through holes 42a may be one or the through hole 42a is not necessarily formed.

The first bonding portion 40 is arranged by being offset on the negative side in the Y direction with respect to the connecting portion 42. On an end portion on the positive side in the X direction of the first bonding portion 40, a first bending portion 43 bent upward at a substantially right angle is formed. The width in the Y direction of the first bending portion 43 is smaller than the width in the Y direction of the first bonding portion 40. In addition, in the first bonding portion 40, a part of the outer edge connected to the first bending portion 43 is cut out, and a cutout portion 40a extending to the negative side in the X direction is formed.

The cutout portion 40a functions as a clearance for obtaining a bending shape of the first bending portion 43. The cutout portion 40a is positioned on the negative side (outsides) in the Y direction than the end portion on the negative side in the Y direction of the connecting portion 42. The first bending portion 43 is connected to the end portion on the negative side in the X direction and the negative side in the Y direction of the connecting portion 42. That is, the width in the Y direction of the first bending portion 43 is smaller than the width in the Y direction of the connecting portion 42.

On the lower surface of the first bonding portion 40, four first protrusions 45 are formed. The four first protrusions 45 are arranged by being offset on the outer peripheral side of the first bonding portion 40. That is, the first protrusions 45 are arranged in respective four corners of the first bonding portion 40. Among the four first protrusions 45, the two first protrusions 45 on the negative side in the Y direction are arranged on the negative side (outsides) in the Y direction than the cutout portion 40a.

The second bonding portion 41 is arranged by being offset on the positive side in the Y direction with respect to the connecting portion 42. On an end portion on the negative side in the X direction of the second bonding portion 41, a second bending portion 44 bent upward at a substantially right angle is formed. The width in the Y direction of the second bending portion 44 is smaller than the width in the Y direction of the second bonding portion 41. In addition, in the second bonding portion 41, a part of the outer edge connected to the second bending portion 44 is cut out, and a cutout portion 41a extending to the positive side in the X direction is formed.

The cutout portion 41a functions as a clearance for obtaining a bending shape of the second bending portion 44. The cutout portion 41a is positioned on the positive side (outsides) in the Y direction than the end portion on the positive side in the Y direction of the connecting portion 42. The second bending portion 44 is connected to the end portion on the positive side in the X direction and the positive side in the Y direction of the connecting portion 42. That is, the width in the Y direction of the second bending portion 44 is smaller than the width in the Y direction of the connecting portion 42.

On the lower surface of the second bonding portion 41, two second protrusions 46 are formed. The two second protrusions 46 are arranged side by side along the Y direction. Among the two second protrusions 46, the second protrusion 46 positioned on the positive side in the Y direction is arranged on the positive side (outsides) in the Y direction than the cutout portion 41*a*. Also, in the configuration illustrated in FIG. 7, the same operational effects as those in the above embodiments can be achieved. Note that, in FIG. 7, as for the first protrusion 45 positioned outside of the cutout portion 40*a*, the whole is not necessarily positioned outside of the cutout portion 40*a*, and it is only necessary that at least a part is positioned outside of the cutout portion 40*a*. The same applies to the second protrusions 46 positioned outside of the cutout portion 41*a*. The two first protrusions 45 on the negative side in the Y direction and the second protrusion 46 on the positive side in the Y direction may be provided distant from the connecting portion 42 than the cutout portion 40*a* and the cutout portion 41*a*, in a plan view. The first bonding portion 40, the connecting portion 42, and the second bonding portion 41 may be arranged so that the outer edge as a whole is formed into a zigzag shape or a W shape.

In the above embodiments, description has been made regarding a case where the first protrusion 45 has a columnar shape. In this case, the first protrusion 45 has a curved surface in a surface facing the gate runner 31, in a plan view. For example, when the facing surface is planar, the stress cannot be relaxed in a portion sandwiched between the first protrusion 45 and the gate runner 31, and the stress concentrates on the portion, which may lead to the breakage of the portion. When the surface facing the gate runner 31 is the curved surface as described above, the occurrence of the local stress can be prevented while relaxing the stress between the first protrusion 45 and the gate runner 31.

Figure 8:
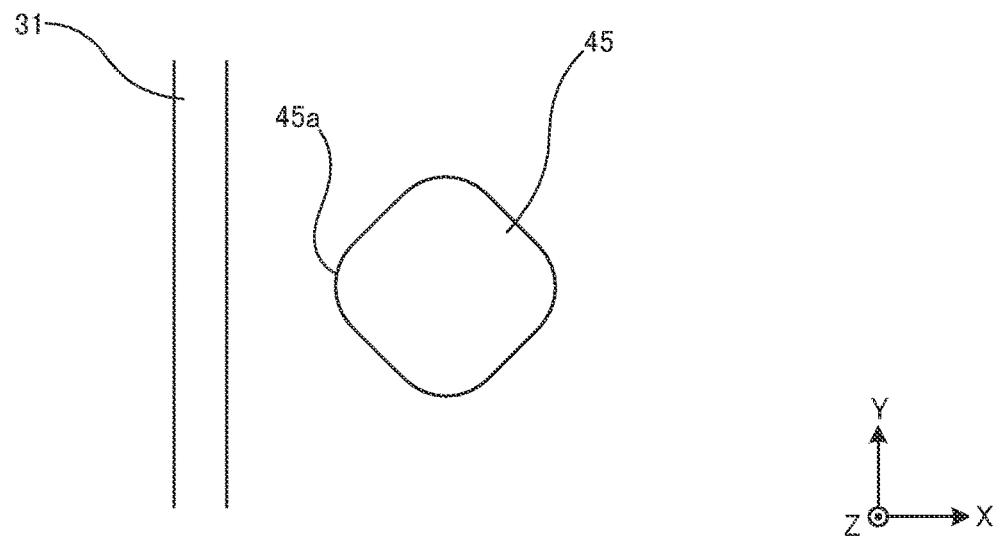
FIG. 8 is a plan view of a metal wiring plate according to another modification and its surroundings.

Note that the shape of the first protrusion 45 is not limited to the columnar shape, and may be the prismatic shape as illustrated in FIG. 8. In this case, a fillet portion 45*a* is preferably formed in a corner of the first protrusion 45. The fillet portion 45*a* has a curved surface in a surface facing the gate runner 31, in a plan view. Even in such a case, the same effect can be achieved.

Figure 9:
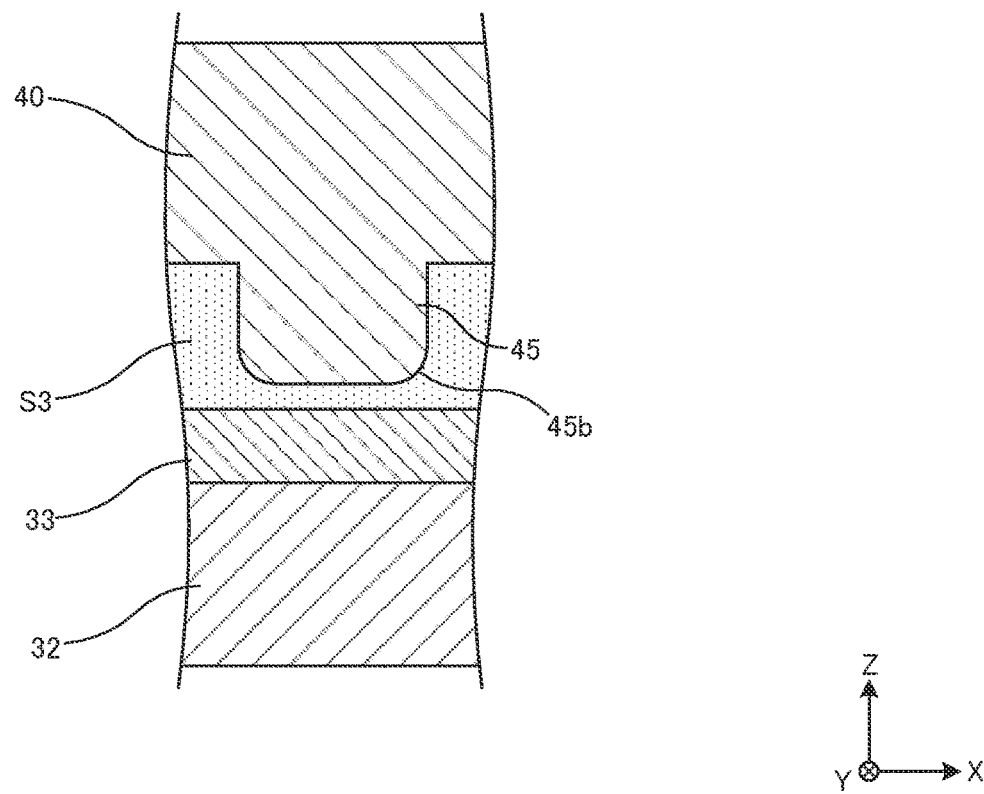
FIG. 9 is a cross sectional view of the metal wiring plate according to another modification and its surroundings.

Not only in a plan view, but also in a cross-sectional view as illustrated in FIG. 9, the first protrusion 45 preferably has a curved surface at a tip end. Specifically, a fillet portion 45*b* is formed in a corner of the lower end of the first protrusion 45. Also, in the cross-sectional view, the first protrusion 45 has a curved surface, which makes it possible to further obtain the stress relaxation effect.

In the above embodiment, the number and arrangement positions of the semiconductor devices 3 are not limited to the above configuration, and can be changed as appropriate.

In the above embodiment, the number and layout of the circuit boards are not limited to the above configuration, and can be changed as appropriate.

In the above embodiment, the laminated substrate 2 and the semiconductor device 3 are formed into a rectangular shape or square shape in a plan view, however, this configuration is not limited thereto. The laminated substrate 2 and the semiconductor device 3 may be formed into a polygonal shape other than the above.

In the above embodiment, description has been made regarding a case where the bonding materials S1 to S4 constitute solder; however, this configuration is not limited thereto. The bonding material may be made of a sintered material, for example.

Furthermore, in the above embodiment, description has been made regarding a case where the distance between the boundary portion 34 and the first protrusion 45 is indicated by the predetermined distance X2 parallel to the X direction; however, this configuration is not limited thereto. A starting point indicating the predetermined distance X2 changes according to the shape of the first protrusion 45, and for example, a shortest distance between the boundary portion 34 and the outer edge of the first protrusion 45 may be considered as the predetermined distance X2. In this case, the predetermined distance X2 is not necessarily defined by a direction parallel to the X direction.

Although the present embodiment and modifications have been described, the above embodiment and modifications may be combined in whole or in part as another embodiment.

The present embodiment is not limited to the above embodiment and modifications, and various changes, substitutions, and alterations may be made without departing from the spirit of the technical idea. Furthermore, if the technical idea can be implemented in other ways by technical advances or other techniques derived, the method may be used. Therefore, the claims cover all embodiments that can be included within the scope of the technical idea.

The characteristic points of the above embodiment will be described in summary below.

The semiconductor module described in the above embodiment includes a semiconductor device having a gate runner formed in an upper surface thereof, the gate runner extending in a predetermined direction, and a metal wiring plate arranged on the upper surface of the semiconductor device. The metal wiring plate includes a first bonding portion bonded to the upper surface of the semiconductor device via a first bonding material. The first bonding portion has a plurality of first protrusions protruding toward the semiconductor device. The first protrusion is provided in a position distant from the gate runner by a predetermined distance in a plan view.

In the above semiconductor module, the sum of areas of the plurality of first protrusions is 0.5% or more and 25% or less of an area of the first bonding portion.

In the above semiconductor module, the first protrusion is provided at a position distant from an outer edge of the first bonding portion by a predetermined distance or more.

In the above semiconductor module, the first protrusion has a curved surface in a surface facing the gate runner in a plan view.

In the above semiconductor module, the first protrusion has a curved surface at a tip end in a cross-sectional view.

In the above semiconductor module, the first protrusion has a columnar shape, a truncated cone shape, or a hemispherical shape.

In the above semiconductor module, the plurality of first protrusions are arranged along an outer peripheral edge of the first bonding portion and to sandwich the gate runner, in a plan view.

In the above semiconductor module, the plurality of first protrusions are arranged side by side along an extending direction of the gate runner, in a plan view.

In the above semiconductor module, the first protrusion is distant from the gate runner by 0.4 mm or more, in a plan view.

In the above semiconductor module, the first protrusion is provided in a range of 0.4 mm or more and 2.0 mm or less inward from an outer edge of the first bonding portion.

In the above semiconductor module, a protrusion height of the first protrusion is 50 μm or more and 300 μm or less.

In the above semiconductor module, the first protrusion has a columnar shape or a truncated cone shape, and an outer diameter thereof is 0.4 mm or more and 1.5 mm or less.

In the above semiconductor module, the semiconductor device includes an upper surface electrode provided on an upper surface and a plating layer provided on an upper surface of the upper surface electrode. The gate runner is formed to pass through the plating layer in the upper surface of the upper surface electrode. The first protrusion is distant from a boundary portion in which the gate runner, the upper surface electrode, and the plating layer gather one another, by a predetermined distance.

In the above semiconductor module, the gate runner extends to divide the upper surface of the semiconductor device into a plurality of pieces. The plurality of first protrusions are arranged on each upper surface of the semiconductor device defined by the gate runner.

In the above semiconductor module, the gate runner is formed into a lattice shape on the upper surface of the semiconductor device, and the first protrusions are arranged one by one on each upper surface of the semiconductor device defined by the lattice-like gate runner. The sum of areas of the first protrusions is 0.5% or more and 25% or less of an area of the first bonding portion in each defined upper surface of the semiconductor device.

In the above semiconductor module, the semiconductor device includes a gate pad in a center of one side, the gate pad having a rectangular shape. In the upper surface of the semiconductor device, the gate runner is formed into a T shape as a whole by extending from the gate pad in a direction perpendicular to the one side, stopping midway between the one side and the other side, and extending from the stopped point in a direction parallel to the one side. The first protrusions are arranged one by one in the upper surfaces of the semiconductor device defined by the T-shaped gate runner. The plurality of first protrusions are arranged in one partition on the other side.

In the above semiconductor module, a laminated substrate in which a first circuit board and a second circuit board are arranged is further provided on an upper surface of an insulating plate. The semiconductor device is arranged on the first circuit board. The metal wiring plate includes a second bonding portion bonded on the second circuit board via a second bonding material, and a connecting portion connecting the first bonding portion and the second bonding portion. The second bonding portion has at least one second protrusion protruding toward the second circuit board.

In the above semiconductor module, the first bonding portion, the second bonding portion, and the connecting portion are arranged in a row, in a plan view.

In the above semiconductor module, the first bonding portion and the second bonding portion are arranged to obliquely face each other, with the connecting portion being sandwiched therebetween in a plan view.

In the above semiconductor module, a first bending portion connecting the first bonding portion and the connecting portion is further provided, the first bending portion being bent from an end portion of the first bonding portion toward the connecting portion. A width of the first bending portion is smaller than a width of the first bonding portion. At least a part of the first protrusion is arranged inside of an end portion connected to the first bending portion, and at least a part of the first protrusion is arranged outside of the end portion connected to the first bending portion.

In the above semiconductor module, a second bending portion connecting the second bonding portion and the connecting portion is further provided, the second bending portion being bent from an end portion of the second bonding portion toward the connecting portion. A width of the second bending portion is smaller than a width of the second bonding portion. At least a part of the second protrusion is arranged inside of an end portion connected to the second bending portion, and at least a part of the second protrusion is arranged outside of the end portion connected to the second bending portion.

In the above semiconductor module, the first bonding portion has a cutout portion formed by cutting out a part of an outer edge connected to the first bending portion.

Furthermore, in the above semiconductor module, the semiconductor device further includes a guard ring provided around the plating layer, and the first protrusion is distant from the guard ring by a predetermined distance.

INDUSTRIAL APPLICABILITY

As described above, the present invention has the effect of suppressing stress concentration between a chip and a lead frame while ensuring thickness of solder; and is especially useful for a semiconductor module.

The present application is based on Japanese Patent Application No. 2019-188628 filed on Oct. 15, 2019. The entire contents of which are incorporated herein.

What is claimed is:
1. A semiconductor module, comprising:
a semiconductor device having a gate runner extending in a first direction at an upper surface of the semiconductor device, the semiconductor device further including an upper surface electrode provided on the upper surface thereof and a plating layer provided on an upper surface of the upper surface electrode; and
a metal wiring plate having a first bonding portion with a bonding surface to which the upper surface of the semiconductor device is bonded via a first bonding material, wherein
the first bonding portion has a plurality of first protrusions at the bonding surface, each first protrusion protruding toward the semiconductor device, and
each first protrusion is provided at a position separated from a boundary portion in which the gate runner and the plating layer are gathered by a first distance in a plan view of the semiconductor module.

2. The semiconductor module according to claim 1, wherein
a sum of areas of the plurality of first protrusions is in a range of 0.5% to 25% of an area of the bonding surface of the first bonding portion.

3. The semiconductor module according to claim 1, wherein
said each first protrusion is provided at a position apart from an outer edge of the first bonding surface of the first bonding portion by a second distance.

4. The semiconductor module according to claim 1, wherein
one of the first protrusions has a curved surface facing the gate runner in the plan view.

5. The semiconductor module according to claim 1, wherein
one of the first protrusions has a curved surface at a tip end in a cross-sectional view.

6. The semiconductor module according to claim 1, wherein
one of the first protrusions has a columnar shape, a truncated cone shape, or a hemispherical shape.

7. The semiconductor module according to claim 1, wherein
the plurality of first protrusions are arranged along an outer peripheral edge of the first bonding portion so as to sandwich the gate runner in the plan view.

8. The semiconductor module according to claim 1, wherein
the plurality of first protrusions are arranged side by side along the first direction of the gate runner in the plan view.

9. The semiconductor module according to claim 1, wherein
said each first protrusion is separated from the gate runner by 0.4 mm or more in the plan view.

10. The semiconductor module according to claim 1, wherein
said each first protrusion is provided in a range of 0.4 mm to 2.0 mm inward from an outer edge of the first bonding surface of the first bonding portion.

11. The semiconductor module according to claim 1, wherein
a protrusion height of said each first protrusion is in a range of 50 μm to 300 μm.

12. The semiconductor module according claim 1, wherein
said each first protrusion has a columnar shape or a truncated cone shape, and an outer diameter of said each first protrusion is in a range of 0.4 mm to 1.5 mm.

13. The semiconductor module according to claim 1, wherein
the gate runner passes through the plating layer to reach the upper surface of the upper surface electrode, so that the gate runner and the plating layer are gathered in the boundary portion of the upper surface electrode.

14. The semiconductor module according to claim 13, wherein
the upper surface of the semiconductor device has a rectangular shape with four sides in the plan view, and the semiconductor device further includes a gate pad in a center of one of the four sides on the upper surface thereof,
at the upper surface of the semiconductor device, the gate runner extends from the gate pad to an other one of the four sides that is parallel to the one of the four sides in a direction perpendicular to the one and the other one of the four sides, and
the first protrusions are arranged in linear symmetry about the gate runner.

15. The semiconductor module according to claim 13, wherein
the gate runner extends to divide the upper surface of the semiconductor device into a plurality of pieces, and each the plurality of first protrusions is arranged on a respective one of the pieces of the upper surface of the semiconductor device.

16. The semiconductor module according to claim 15, wherein
the gate runner is formed into a lattice shape on the upper surface of the semiconductor device, and
the plurality of pieces of the upper surface of the semiconductor device includes a plurality of lattice surfaces defined by the gate runner, and each of the lattice surfaces has a respective one of the first protrusions arranged one by one thereon, and the sum of areas of the first protrusions is in a range of 0.5% to 25% of an area of the first bonding surface of the first bonding portion.

17. The semiconductor module according to claim 15, wherein
the upper surface of the semiconductor device has a rectangular shape with four sides in the plan view, and the semiconductor device further includes a gate pad in a center of one of the four sides on the upper surface of the semiconductor device,
at the upper surface of the semiconductor device, the gate runner is formed into a T shape as a whole by extending from the gate pad in a direction perpendicular to the one of the four sides, stopping midway between the one and the other one of the four sides, and extending from the stopped point in a direction parallel to the one of the four sides, and
one of the first protrusions is arranged in each of two partitions partitioned by the T-shaped gate runner at a side closer to the one of the four sides than the other one of the four sides of the upper surface of the semiconductor device, and two or more of the first protrusions are arranged in a partition partitioned by the T-shaped gate runner at a side closer to the other one of the four sides than the one of the four sides.

18. The semiconductor module according to claim 1, further comprising:
a laminated substrate including an insulating plate with an upper surface, and a first circuit board and a second circuit board provided on the upper surface of the insulating plate, wherein
the semiconductor device is provided on the first circuit board,
the metal wiring plate has a second bonding portion with a second bonding surface to which the second circuit board is bonded via a second bonding material, and a connecting portion connecting the first bonding portion and the second bonding portion, and
the second bonding portion has at least one second protrusion at the second bonding surface that protrudes toward the second circuit board.

19. The semiconductor module according to claim 18, wherein
the first bonding portion, the second bonding portion, and the connecting portion are aligned in the plan view.

20. The semiconductor module according to claim 18, wherein
the first bonding portion and the second bonding portion face each other diagonally, and sandwich the connecting portion therebetween in the plan view.

21. The semiconductor module according to claim 18, further comprising:
a first bending portion connecting the first bonding portion and the connecting portion, the first bending portion having a curved shape bent from one side of the first bonding portion toward the connecting portion, wherein
a width of the first bending portion at the one side of the first bonding portion is smaller than a length of the one side of the first bonding portion, and
at least one of the first protrusions faces the first bending portion in a direction perpendicular to the one side of the first bonding portion, and at least one of the first protrusions faces a portion of the one side of the first bonding portion in which the first bending portion is not connected.

22. The semiconductor module according to claim 21, further comprising:
a second bending portion connecting the second bonding portion and the connecting portion, the second bending portion having a curved shape bent from one side of the second bonding portion toward the connecting portion, wherein a width of the second bending portion is smaller than a length of the one side of the second bonding portion, and at least one of the second protrusion includes a plurality of second protrusions, and at least one of the second protrusion faces the second bending portion in a direction perpendicular to the one side of the second bonding portion, and at least one of the second protrusions faces a portion of the one side of second bonding portion in which the second bending portion is not connected.

23. The semiconductor module according to claim 21, wherein the first bonding portion has a cutout at the one side adjacent to the first bending portion.

24. The semiconductor module according to claim 13, wherein the semiconductor device further includes a guard ring surrounding the plating layer in the plan view, and the first protrusions are separated from the guard ring by a third distance in the plan view.

\* \* \* \* \*